United States Patent [19]

Morizuka

[11] Patent Number: 5,153,692
[45] Date of Patent: Oct. 6, 1992

[54] SEMICONDUCTOR DEVICE

[75] Inventor: Kouhei Morizuka, Yokohama, Japan

[73] Assignee: Kabushiki Kaisha Toshiba, Kawsaki, Japan

[21] Appl. No.: 676,548

[22] Filed: Mar. 28, 1991

[30] Foreign Application Priority Data

Mar. 30, 1990 [JP] Japan ................................ 2-84373

[51] Int. Cl.$^5$ ............................................. H01L 29/72
[52] U.S. Cl. ....................................................... 357/34
[58] Field of Search ........................................ 357/34

[56] References Cited

FOREIGN PATENT DOCUMENTS

0184016A1 6/1986 European Pat. Off. .

OTHER PUBLICATIONS

Lin et al.; "Super-Gain AlGaAs/GaAs Heterojunction Bipolar Transistors Using an Emitter Edge-Thinning Design"; Appl. Phys. Letters; vol. 47, No. 8, Oct. 1985; pp. 839-841.

W.-S. Lee et al., "Effect of Emitter-Base Spacing on the Current Gain of AlGaAs/GaAs Heterojunction Bipolar Transistors", IEEE Electron Device Letters, vol. 10, No. 5, May 1989, pp. 200-202.

O. Nakajima et al., "High-Performance AlGaAs/GaAs HBT's Utilizing Proton-Implanted Buried Layers and Highly Doped Base Layers", IEEE Transactions on Electron Devices, vol. ED-34, No. 12, Dec. 1987, pp. 2393-2398.

Primary Examiner—John D. Lee
Assistant Examiner—Robert E. Wise
Attorney, Agent, or Firm—Finnegan, Henderson, Farabow, Garrett and Dunner

[57] ABSTRACT

In a semiconductor device, a depletion region is provided in a part of an emitter region by pinning Fermi level at Schottky junction or an interface with a high-resistivity semiconductor layer or surface thereof. The depletion region is extended throughout a full thickness of the emitter layer, thereby to prevent electrons from being diffused in the direction of the interface with the high-resistivity semiconductor layer so as to recombine through crystalline defects. Thus, the current gain of the device is greatly increased.

9 Claims, 26 Drawing Sheets

SEMICONDUCTOR DEVICE

BACKGROUND OF THE INVENTION

1. Field of the Invention

The present invention relates to a semiconductor devices and more particularly, to element isolation in a heterojunction bipolar transistor using III-V compound semiconductor such as gallium arsenic (GaAs).

2. Description of the Related Art

A heterojunction bipolar transistor (HBT) has very promising prospects as a transistor for use in a microwave circuit and a high-speed logical circuit because of its excellent performances in high frequency and switching operations compared with silicon bipolar transistors.

An HBT using GaAs, in particular, is being developed as a superhigh speed device for the next generation.

In order to realize a high-speed and low-power consumption transistor, miniaturing techniques are required. However, the miniaturizing techniques have big problems, which must be solved in future.

For example, an $Al_xGa_{1-x}As/GaAs$ heterjunction bipolar transistor comprises a wafer as shown in FIG. 12. The wafer is formed by epitaxially growing an $n^-$ type GaAs layer as a collector layer 102, a $p^+$ type GaAs layer as a base layer 103, and an n type $Al_xGa_{1-x}As$ layer as an emitter layer 104 sequentially on an insulating GaAs substrate 101 with the use of a molecular beam epitaxy (MBE) technique, a metal organic chemical vapor deposition (MOCVD) technique or the like techniques.

The wafer thus formed is then subjected to a mesa etching to expose the collector layer 102 and the base layer 103. Subsequently, a collector electrode 105, a base electrode 106 and an emitter electrode 107 are formed thereon, and protons or boron are implanted to thereby form an element isolation region 108 having a high resistance as shown in FIG. 13.

A heterojunction bipolar transistor thus prepared is shown by a plan view in FIG. 14. In the connection of the transistor to other elements or pads located outside the transistor, the base and collector electrodes 106 and 105 can be led directly onto the element isolation region 108 of a semi-insulated high-resistance layer. Therefore, these electrodes can be easily connected to other outside elements. On the other hand, when the emitter electrode 107 is to be led out outwards in the same manner, it is short-circuited with the p type GaAs layer surrounding the mesa portion of the emitter.

For the purpose of avoiding the short circuit, the surface of the emitter electrode 107 is coated with an insulating film such as a silicon oxide film, a contact hole H is provided on the emitter electrode 107, and a leading wire 109 is formed through the contact hole as shown in FIG. 15.

However, this structure requires space for the contact hole and allowance for positioning with respect to the contact hole in the emitter electrode 107, which unfavorably impedes the miniaturization of the device.

For eliminating this problem, it has been exercised that the top surface of the emitter mesa is also subjected to the implantation of proton or boron ions so as to form a high resistance top surface, and the side surface of the emitter region 104 is made contacted with the high-resistance region as shown in FIG. 16. With this structure, the emitter electrode 109 can be lead out outside of the emitter region 104 without requiring any contact hole and the device can be miniaturized because the area of the emitter electrode can be reduced without space for contact hole and allowance for the positioning of the contact hole.

The above-described method for providing a high resistance on the top of the emitter mesa by the implantation of proton or boron ions therein is effective in simplifying the miniaturizing process. This method, however, has a problem that, since crystalline defects introduced by the ion implantation are directly contacted with the interface of the emitter-base junction, an electric current created by the generation and recombination is increased in the interface region, whereby the current gain of the transistor is decreased.

Referring to FIG. 17 which is a cross-sectional view taken along line A—A in FIG. 16, recombination centers (shown by marks x in FIG. 17) are induced by the ion implantation in the junction between the p type GaAs layer of the base layer 103 and the n type $Al_xGa_{1-x}As$ layer of the emitter layer 104, and electrons injected through the emitter are recombined in the recombination centers.

Table 1 shows leak currents on the mesa isolation end surface and ion implantation isolation end surface when the base-emitter voltage is applied such that the collector current density becomes $10^4 A/cm^2$ in the heterojunction bipolar transistor.

TABLE 1

| Mesa isolation type: | 0.1 uA/um |
|---|---|
| Ion implantation isolation type: | 30 uA/um |

As shown in Table 1, the leak current on the mesa isolation end face is 0.1 uA/$\mu$m whereas the leak current on the ion implantation end face is 30 uA/$\mu$m, which is 300 times of that flowing on the mesa isolation end face. The leak current on the mesa isolation end face is mainly the surface recombination current.

Assuming that in FIG. 16, emitter length is the length of the mesa isolation end face and emitter width is the length of the ion implantation isolation end face, FIG. 18 shows the current gain of the transistor when the emitter length of the transistor is varied with the emitter width W being 2 $\mu$m. It will be seen from FIG. 18 that as the emitter length is decreased, the influence of the recombination current on the ion implantation isolation end face becomes greater and thus the current gain of the transistor is decreased. Accordingly, it is practically impossible to reduce the emitter length, which impedes the miniaturization of the device.

As discussed above, providing a high resistance to the emitter/base end face for isolation by the ion implantation in the heterojunction bipolar transistor has a problem that, as the emitter length is decreased, the influence of the recombination current on the ion implantation isolation end face is increased and the current gain of the transistor is decreased.

SUMMARY OF THE INVENTION

In view of the above circumstances, it is an object of the present invention to provide a small heterojunction bipolar transistor having excellent performance capable of preventing increase of recombination current on an ion implantation isolation end face.

According to one aspect of the present invention, emitter and base end faces are subjected to ion implantation to impart high resistance so as to form a high-resistance isolation region. Further, an emitter layer along the end face of the high-resistance isolation region is completely depleted over the full thickness of the emitter layer.

With such an arrangement in which the emitter layer is completely depleted throughout the full thickness thereof along the end face of the high-resistance isolation region, electrons injected through the emitter to the base are prevented from reaching recombination centers which are induced in the previous ion implantation, and the increase of the recombination current on the ion implantation end face and the decrease of the current gain of the transistor can be prevented. Thus, even in the miniaturized transistor area, the reduction of the current gain factor can be prevented.

According to a modification of the present invention, the film thickness of a part of the emitter layer along the peripheral end face of the high-resistance isolation region is reduced and all the thickness-reduced emitter layer part is fully depleted.

According to another modification, a high-resistivity layer is formed by the ion implantation on the part of the emitter layer along the peripheral end face of the high-resistance isolation region so that the film thickness of that emitter layer part is practically reduced.

Assume that the thickness-reduced emitter layer part has a thickness of $T_E$, a pinned Fermi level is $qV\phi$ (eV) from the bottom of the conduction band, the emitter layer has a doping concentration of $N_D$(cm$^{-3}$), the base layer has a doping concentration $N_A$ (cm$^{-3}$), and base-emitter voltage is $V_{BE}$. Then, it is preferable that $T_E$ is determined to satisfy the following relationship (1).

$$T_E \leq \sqrt{\frac{2\epsilon V\phi}{qN_D}} + \sqrt{\frac{2\epsilon\{(kT/q)\ln(N_DN_A/n^2) - V_{BE}\}}{qN_D}} \quad (1)$$

where $\epsilon$ denotes the dielectric constant of the emitter layer, q denotes charge elementary quantity, kT is thermal energy, and n is intrinsic carrier concentration.

As the base-emitter voltage BE (V) increases, the upper limit value of the film thickness $T_E$ of the emitter layer decreases. However, when the thickness of the emitter layer is previously set to satisfy the following relationship (2), $$T_E \leq \frac{2\epsilon V\phi}{qN_D} \quad (2)$$

a variation in the performances caused by a biasing voltage can be made small, and thus more preferable performances can be obtained.

DESCRIPTION OF THE PREFERRED EMBODIMENTS

Embodiments of the present invention will be detailed with reference to the accompanying drawings.

Figure 1:
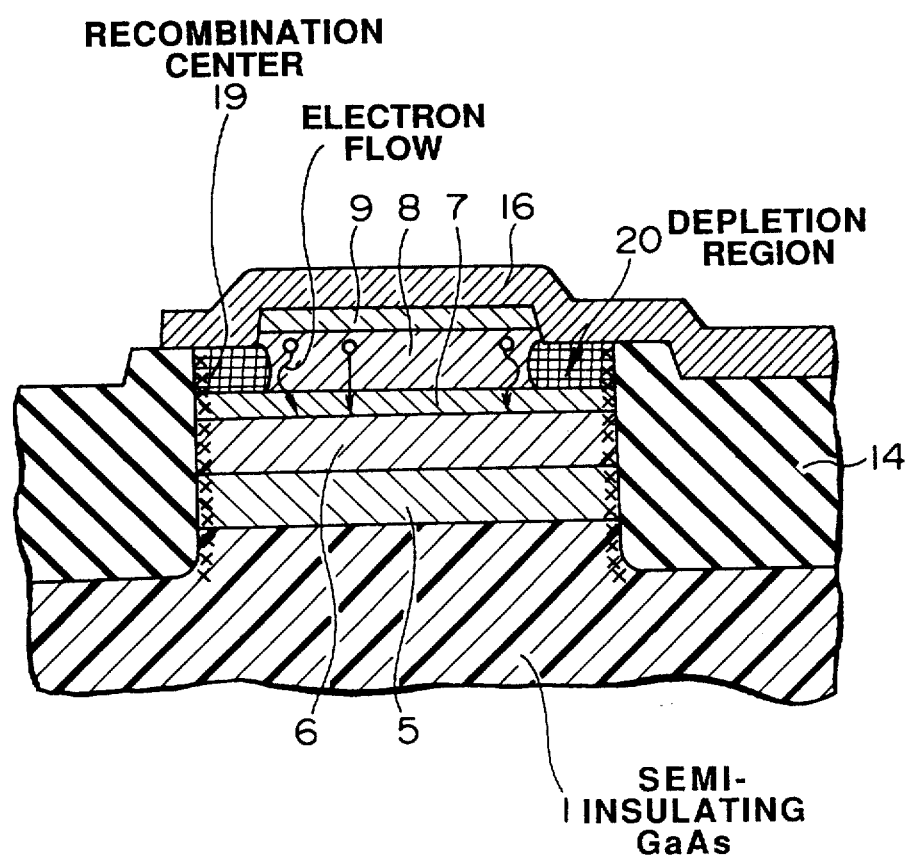
FIG. 1 shows a heterojunction bipolar transistor in accordance with a first embodiment of the present invention.

An $Al_xGa_{1-x}As$/GaAs heterojunction bipolar transistor in accordance with an embodiment of the present invention is featured, as shown in FIG. 1, by comprising an n$^+$ type GaAs layer 5 as a collector contact layer, an n$^-$ type GaAs layer 6 as a collector layer, a p$^+$ type $Al_xGa_{1-x}As$ graded-composition layer 7 as a base layer, an n$^-$ type $Al_xGa_{1-x}As$ 8 as an emitter layer, and an n$^+$ type $In_yAl_xGa_{(1-x-y)}As$ layer 9 as an emitter contact layer sequentially formed as laminated on a semi-insulating GaAs substrate 1, and further comprising a high-resistivity layer 11 for isolation between a base and a collector formed through boron ion implantation and a high-resistivity region 14 for inter- element isolation formed through proton implantation; wherein that part of the emitter layer which is contacted with an end face of the high-resistivity isolation region 14 forms a Schottky junction together with an emitter electrode 16 to completely deplete the emitter layer throughout its full thickness.

In the present embodiment, the p$^+$ type $Al_xGa_{1-x}As$ graded-composition layer 7 as the base layer has a film thickness of 1000 Å and a doping concentration of $8 \times 10^{19}$ cm$^{-3}$ and for the purpose of establishing such a pseudo electric field as to accelerate electrons, the $Al_xGa_{1-x}As$ composition of the base is set to have $Al_{0.1}Ga_{0.9}$As in its emitter side and GaAs in its collector side. The n$^-$ type AlGaAs as the emitter layer is set to have a film thickness of 1000 Å and a doping concentration of $5 \times 10^{17}$ cm$^{-3}$.

Further, the InAlGaAs layer as the emitter contact layer is set to have a doping concentration of $3 \times 10^{19}$ cm$^{-3}$, to have the AlGaAs composition of the emitter in its emitter side and $In_{0.5}Ga_{0.5}As$ in its surface side and to vary in composition gradually from its emitter side to the surface, thus preventing generation of such a potential barrier as to block an electron flow.

Explanation will next be made as to how to fabricate the heterojunction bipolar transistor.

Figure 2A:
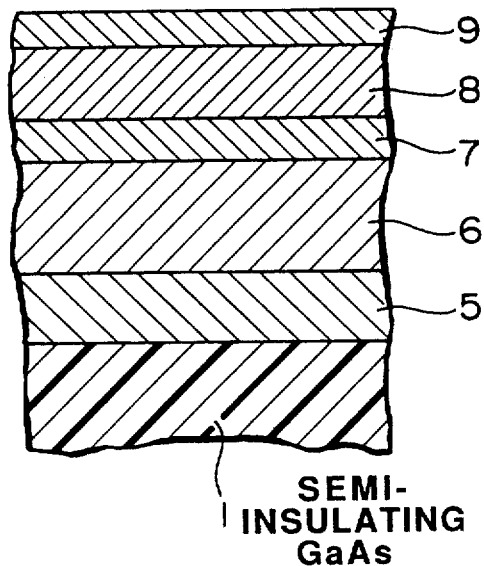
FIGS. 2(a) to 2(o) show steps of fabricating the transistor respectively.

First of all, as shown in FIG. 2(a), an n$^+$ type GaAs layer 5 as a collector contact layer, an n$^-$ type GaAs layer 6 as a collector layer 6, a p$^+$ type $Al_xGa_{1-x}As$ graded-composition layer 7 as a base layer, an n$^-$ type $Al_xGa_{1-x}As$ layer 8 as an emitter layer and an n$^+$ type $In_yAl_xGa_{1-x-y}As$ layer 9 as an emitter contact layer are sequentially formed as laminated on a semi- insulating GaAs substrate 1 by a molecular beam epitaxy (MBE) technique, a metalorganic chemical vapor deposition (MOCVD) technique, or the like technique.

Figure 2B:
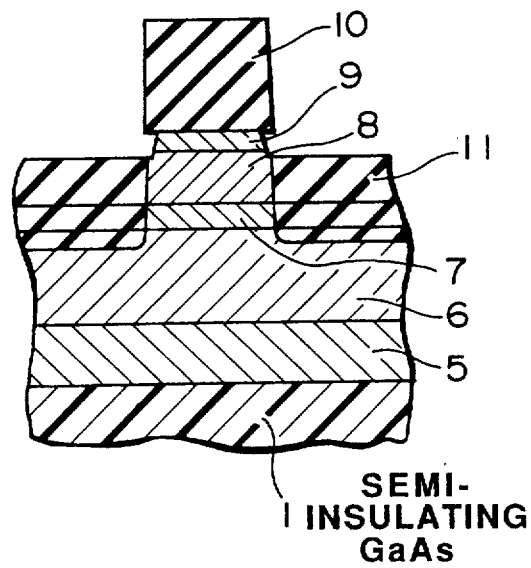

Then, as shown in FIG. 2(b), a silicon oxide layer 10 is formed on the emitter contact layer 9 by the CVD technique and subjected to a patterning operation by a photolithographic process, the emitter contact layer 9 is subjected to an etching operation and then to ion implantation with use of the silicon oxide layer 10 as a mask to form a high-resistivity layer 11 for isolation between the base and collector.

Figure 2C:
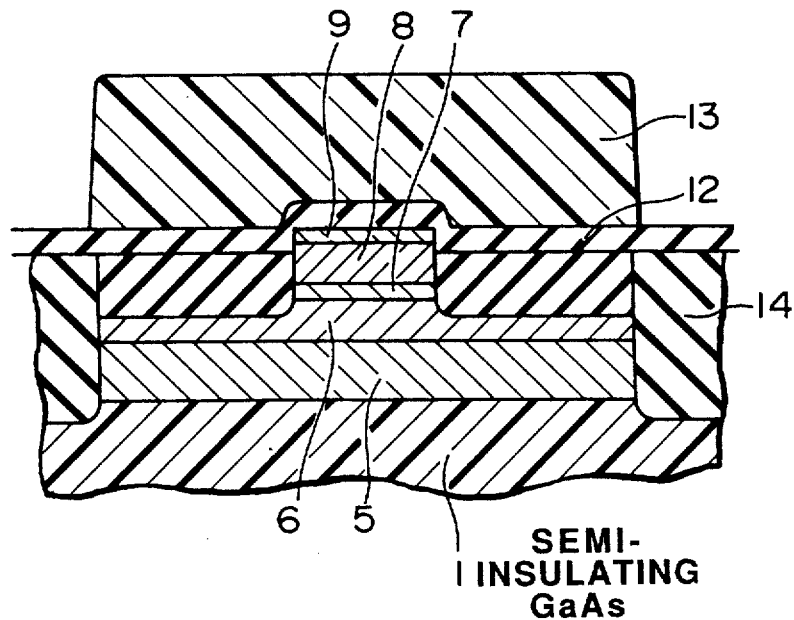
Figure 2D:
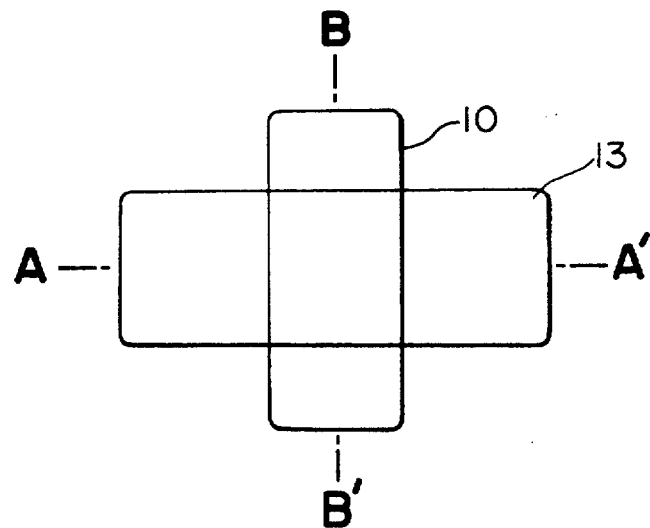
Figure 2E:
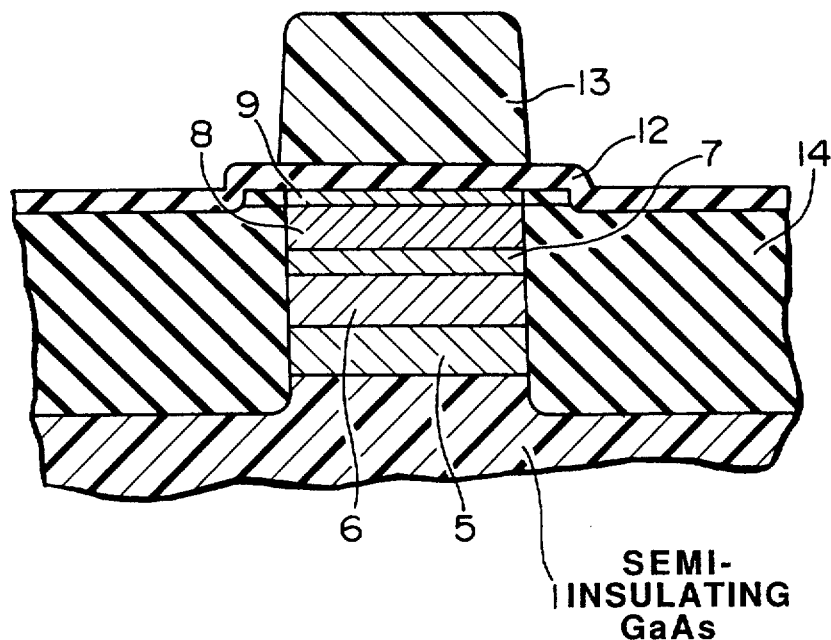

Thereafter, the silicon oxide layer 10 is removed, a silicon oxide film 12 is deposited thereon, a resist pattern 13 is formed thereon, and then the obtained wafer is subjected to a proton implantation with use of the resist pattern 13 as a mask to form a high-resistivity layer 14 for isolation between the base and collector as shown in FIG. 2(c). FIG. 2(d) is a planar positional relationship between the silicon oxide layer 10 used as a mask at the time of forming the high-resistivity layer 11 of the base/collector isolation and the resist pattern 13 used for the formation of the high-resistivity region 14 of the inter-element isolation. FIG. 2(c) is a cross-sectional view taken along line A—A' in FIG. 2(d) and FIG. 2(e) is a cross-sectional view taken along line B—B' in FIG. 2(d).

The silicon oxide film 12 is subjected to etching with use of the resist pattern 13 as a mask and buffered hydrofluosilic acid. In this step, the etching time is adjusted such that the silicon oxide film 12 provides a side etching of about 0.2 um with respect to the mask 13.

Figure 2F:
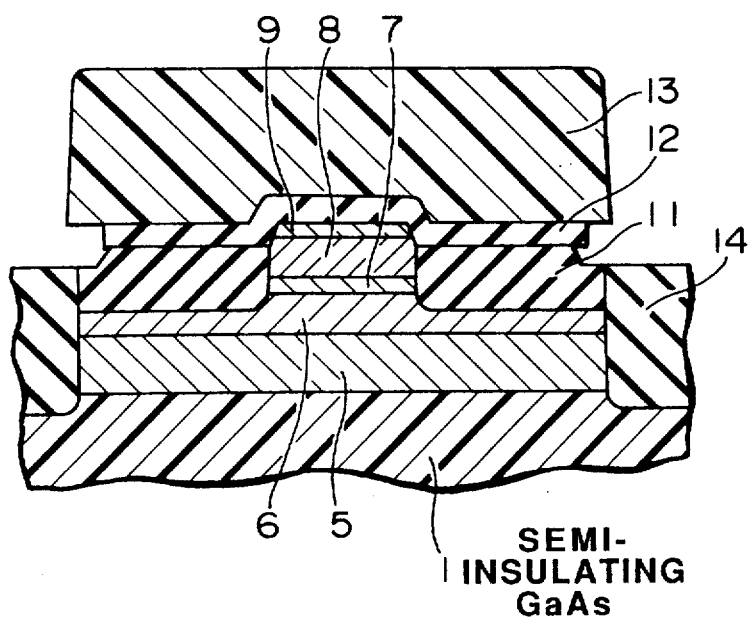
Figure 2G:
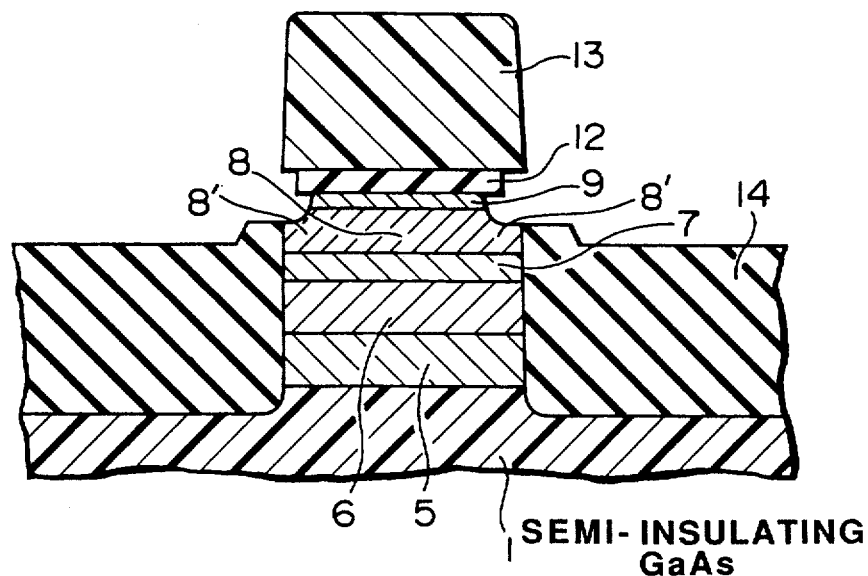

Subsequently, as shown in FIGS. 2(f) and 2(g), the emitter contact layer 9 and the emitter layer 8 are subjected to etching with use of the silicon oxide film 12 as a mask to be partially removed. FIGS. 2(f) and 2(g) are cross-sectional views taken along lines A—A' and B—B' in FIG. 2(d). In this step, the etching time is adjusted such that a part 8' of the emitter 8 which is contacted with the proton-implanted high-resistivity region 14 becomes about 400-500 Å when the etching is completed.

Figure 2H:
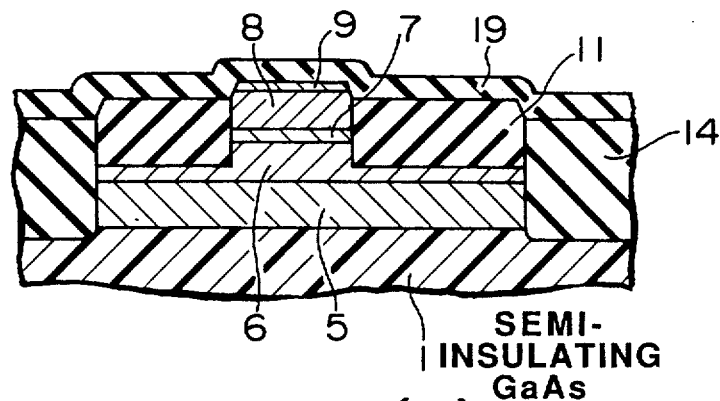

Then, as shown in FIG. 2(h) which is a cross-sectional view taken along line A—A', the resist pattern 13 is removed by an ashing process with use of oxygen plasma, the silicon oxide film 12 is removed with use of the buffered hydrofluosilic acid, and then a silicon oxide film 19 of 5000 Å is deposited by the CVD technique.

Figure 2I:
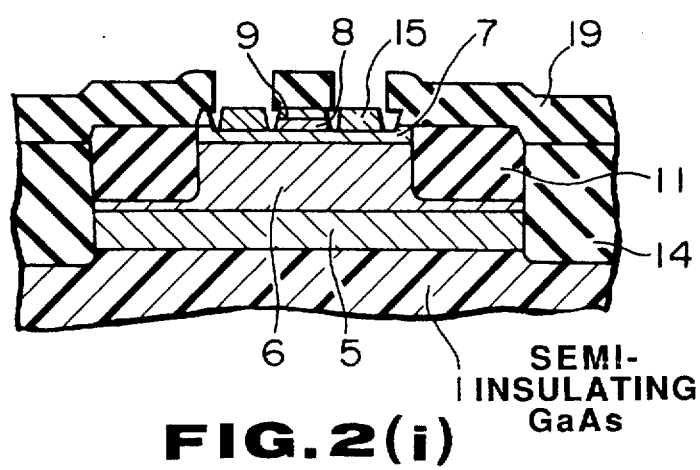

Next, as shown in FIG. 2(i), the silicon oxide film 19 as a base electrode formation region is etched by the photolithographic process, and the emitter layer 8 and the emitter contact layer 9 are further etched to expose the base layer 7. Formed on the exposed region is a base electrode 15 by a deposition technique and a liftoff method.

Figure 2J:
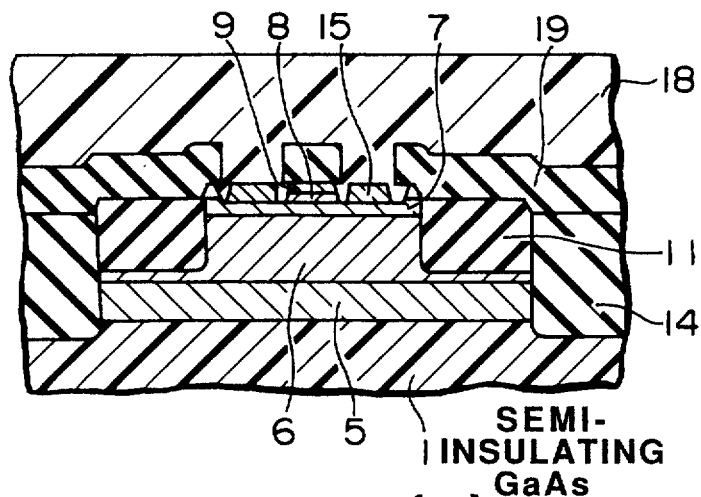

Further, as shown in FIG. 2(j), a polyimide film 18 is coated on the entire surface of the thus-obtained wafer by a spin coating technique. In this step, the polyimide film 18 is coated substantially flat on the wafer because of its viscosity.

Figure 2K:
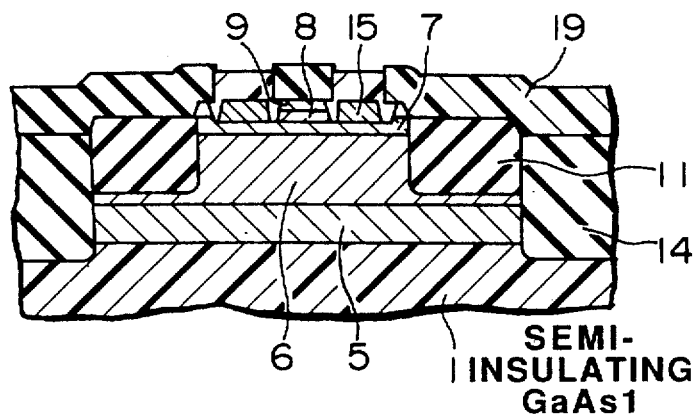

As shown in FIG. 2(k), the polyimide film 18 is subjected to etching in a plasma atmosphere using a mixture gas of $CF_4$ and $O_2$, and the etching process is stopped at the moment the polyimide film is left selectively on the base electrode so that the base electrode and the side wall of the emitter mesa are covered with the polyimide film 18.

Figure 2L:
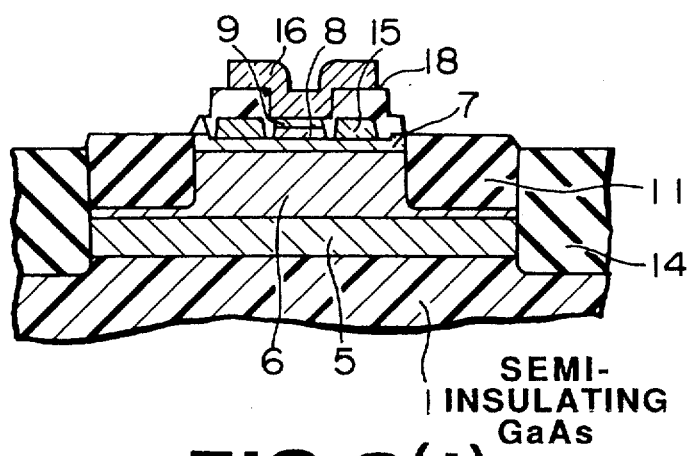

Thereafter, as shown in FIG. 2(l), the silicon oxide film 19 is removed by etching and an emitter electrode 16 is formed on the exposed emitter contact layer 9.

Figure 2M:
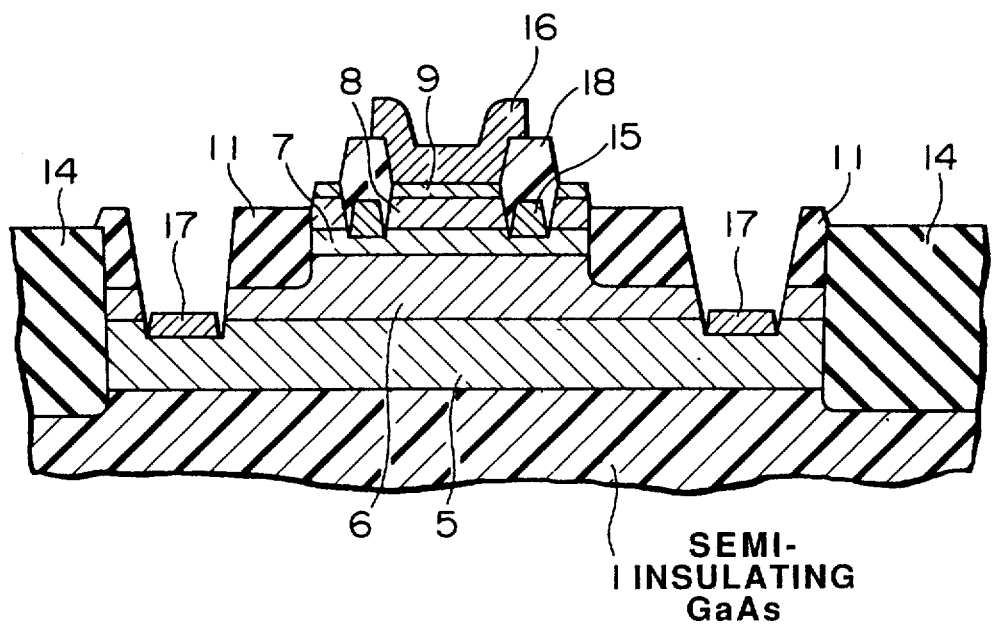
Figure 2N:
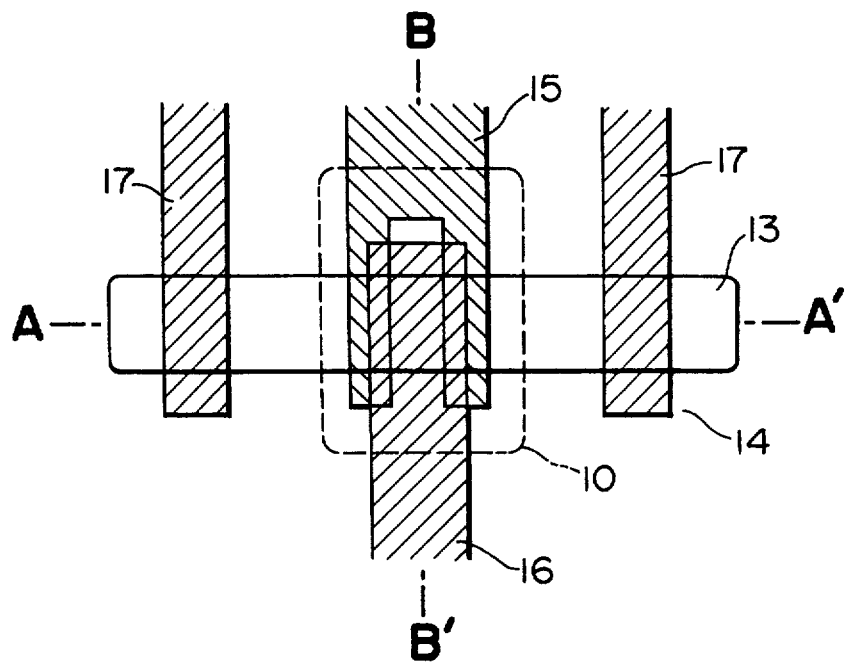
Figure 2O:
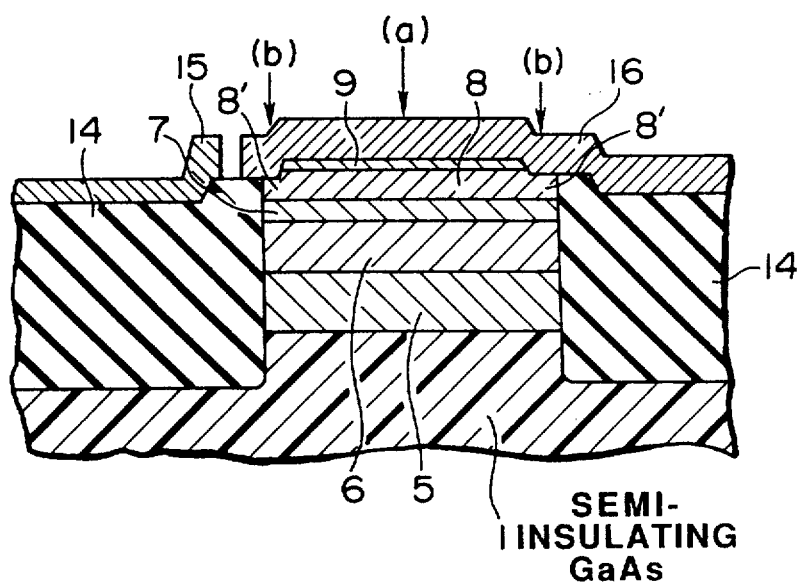

Further, as shown in FIGS. 2(m), 2(n) and 2(o), the wafer is then subjected to etching to make a hole reaching the collector contact layer 5 and a collector electrode 17 is formed in the hole by use of a combination of the deposition and lift-off techniques. FIGS. 2(m) and 2(o) are cross-sectional views taken along lines A—A' and B—B' in FIG. 2(n) respectively. In this step, the emitter electrode is made up of a laminated film of a titanium layer of 1000 Å thickness, a platinum layer of 1000 Å thickness and a gold layer of 4000 Å thickness.

Figure 3:
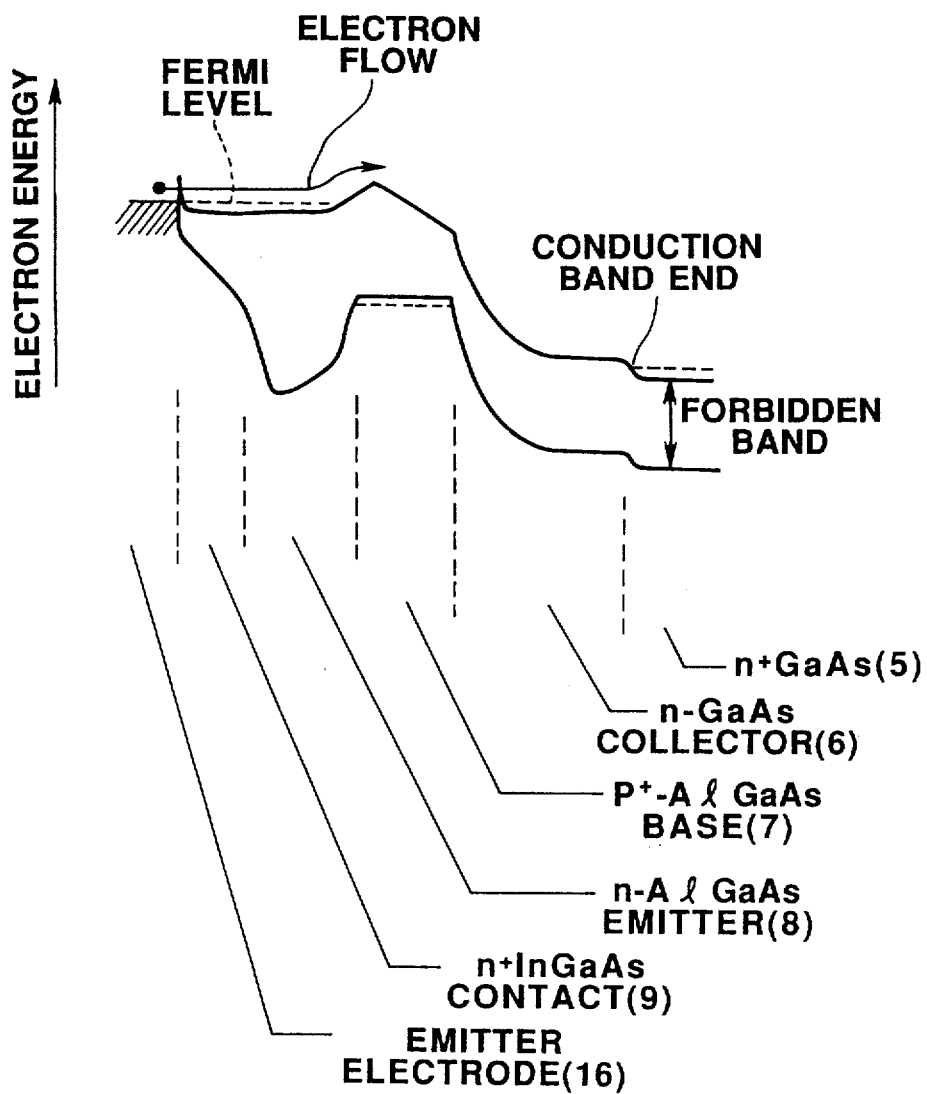
FIGS. 3 and 4 are diagrams for explaining an energy band structure for the transistor respectively.

FIG. 3 shows an energy band structure of an epitaxially grown film at a position shown by an arrow (a) in FIG. 2(o) in its laminated layer direction. In FIG. 3, the emitter/base junction is forward biased and the transistor is put in its active state. Since a Schottky potential barrier level between the emitter electrode 16 and the emitter contact layer 9 is as low as about 0.3 eV and the doping concentration of the contact layer is as high as $3 \times 10^{19}$ cm$^{-3}$, electrons can pass through the potential barrier and move from the emitter electrode 16 to the emitter contact layer 9 by the tunnel effect and thus a good ohmic contact can be obtained.

Figure 4:
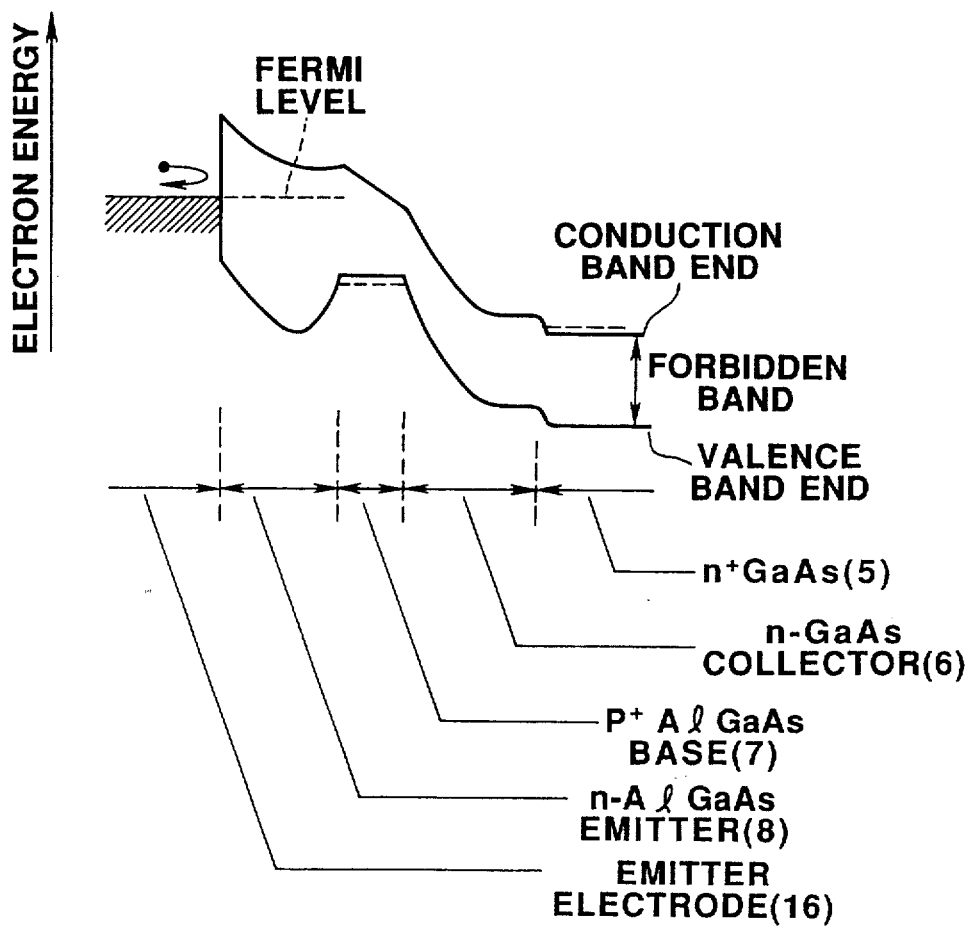
Figure 13:
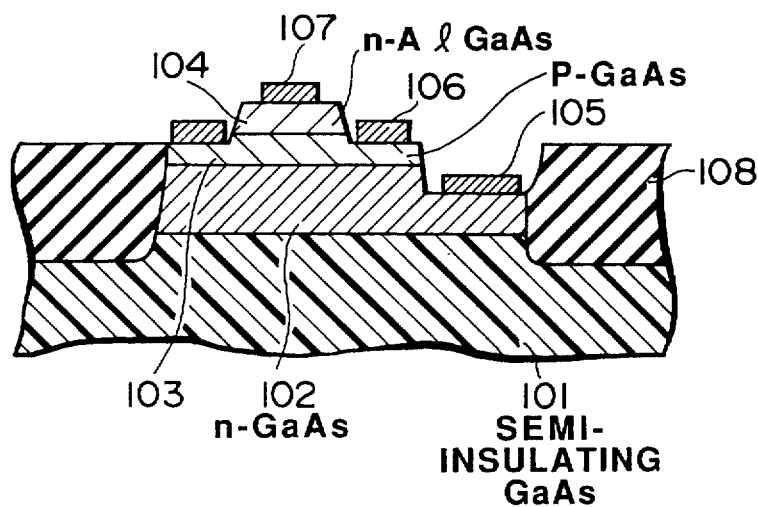
Figure 14:
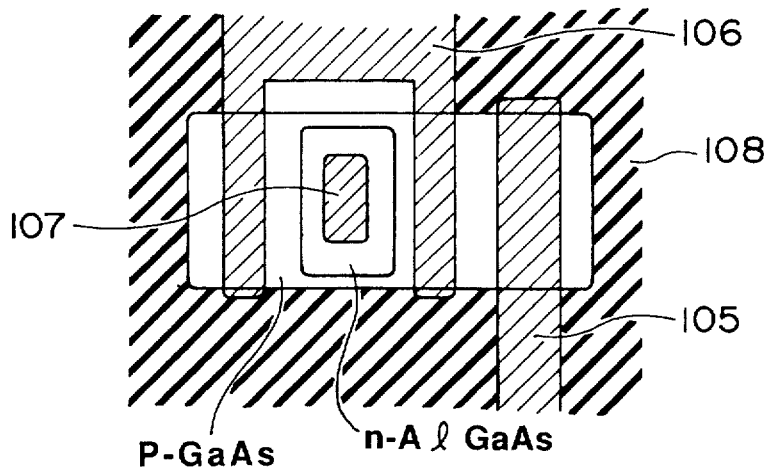
Figure 15:
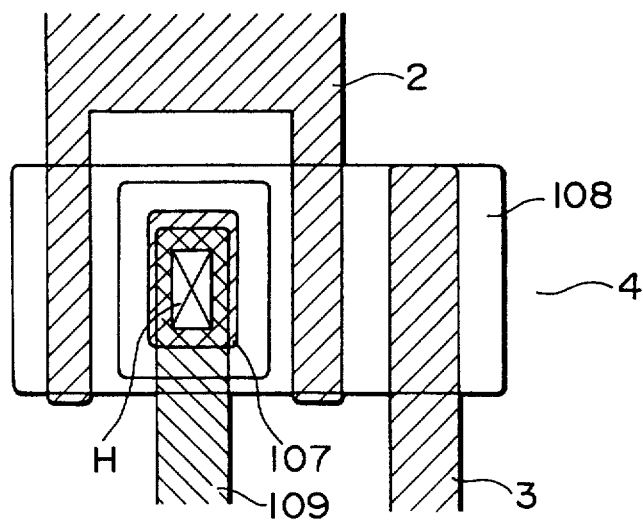
Figure 16:
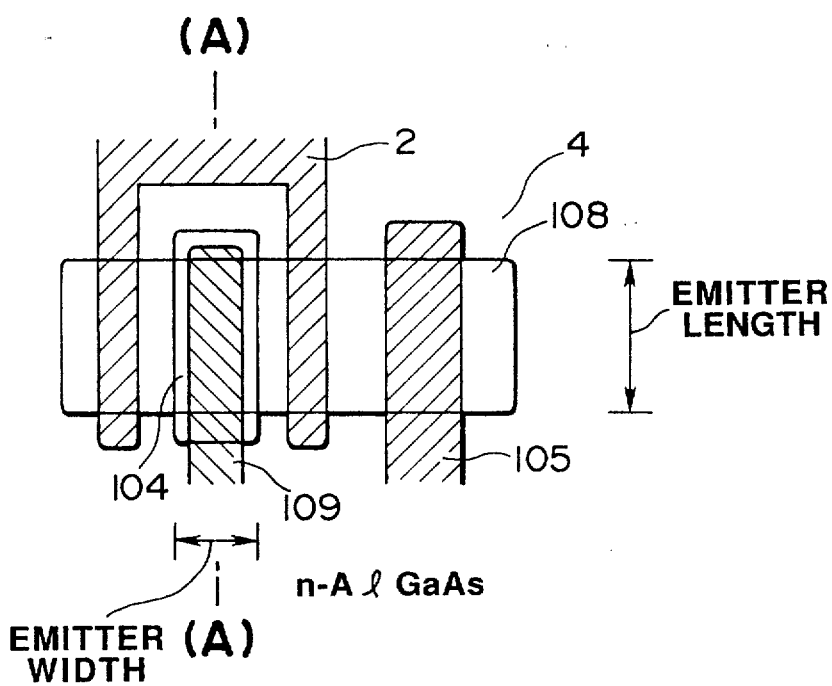
Figure 17:
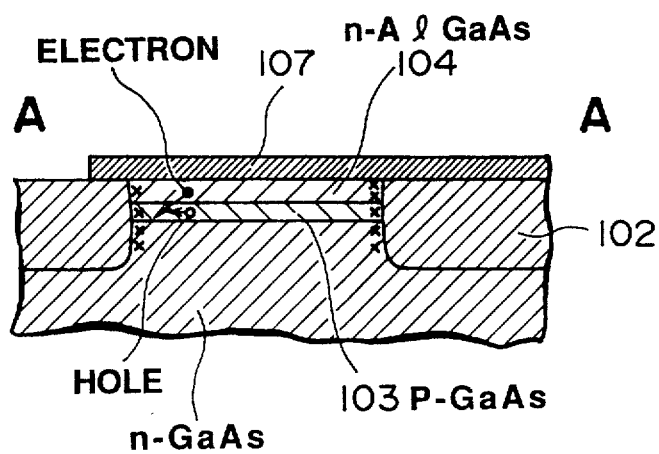
Figure 18:
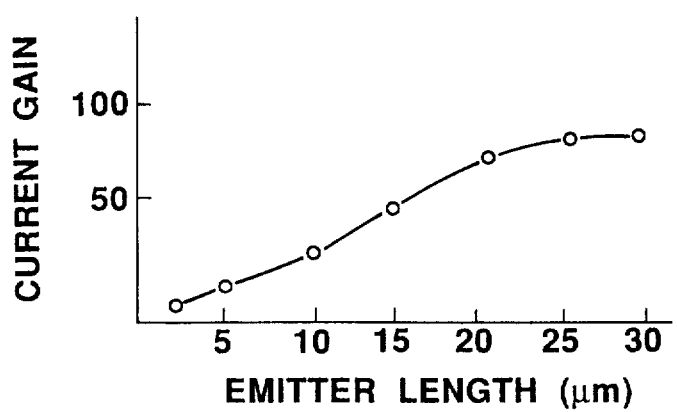

FIG. 4 shows an energy band structure of the epitaxially grown film at a position shown by an arrow (b) in FIG. 2(o) in its laminated layer direction. At the point (b), the emitter electrode 16 has no emitter contact layer 9 therebelow and is contacted directly with the emitter AlGaAs layer 88 having a film thickness of about 400-500 Å. In this case, a Schottky barrier level between the titanium emitter electrode 16 and the AlGaAs layer 8 forming the emitter layer is about 0.8 eV and the contact layer has a doping concentration of $5 \times 10^{17}$ cm$^{-3}$, so that the thickness of the Schottky barrier is as sufficiently large as 460 Å and thus the emitter layer is completely depleted at the point (b) even in the active state, Such a region is shown by a complete depletion region 20 in FIG. 1 and thus the injection of electrons through the emitter electrode 16 is carried out only from that part of the emitter electrode which is contacted at its bottom side with the emitter contact layer 9, as already explained above. When compared with the conventional transistor of FIG. 13, it will be appreciated that the transistor of the present invention is remarkably different from the conventional transistor in the influence of the proton-implanted high-resistivity region 14 or crystalline defects contained therein on the device characteristics.

With the structure of the conventional transistor, recombination of electrons and positive holes actively takes place at such crystalline defects and the current gain is largely reduced. With the structure of the present embodiment of the invention, on the other hand, crystalline defects present in the emitter layer are isolated from the emitter layer 8 of the active region having electrons therein with a spacing of about 0.2 um and thus the defects do not act as recombination centers.

Accordingly, an increase in the leak current resulting from the crystalline defects present in the high-resistivity region 14 can be made zero in principle, and therefore the current gain can be improved to a large extent.

Figure 5:
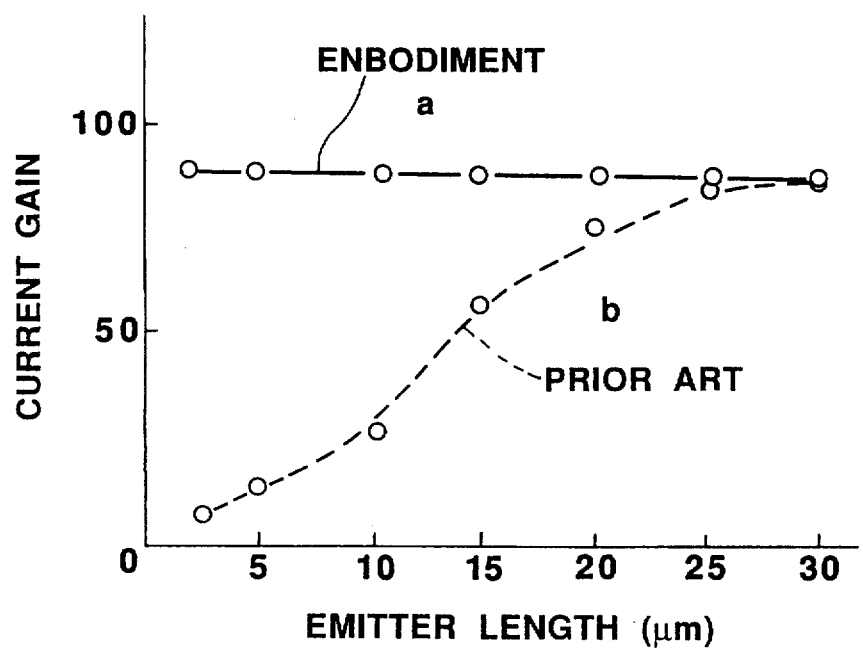
FIG. 5 is a diagram showing relationships between emitter length and current gain with respect to the transistor of the present invention and a conventional transistor.

As in the foregoing embodiment, the emitter width is 2 μm, and transistors having different emitter lengths based on the foregoing embodiment were fabricated as samples and subjected to measurements of current gains. The measurement results are given in FIG. 5 in which a curve a represents the measurement results for the transistors of the present embodiment and a curve b represents the measurement results of the conventional transistor.

It will be seen from the drawing that the current gain remarkably decreases as the emitter length decreases in the conventional transistor, whereas no reduction in the current gain is observed even when the emitter length decreases from 30 μm to 2 μm and a very high level of current gain of about 80 can be obtained in the transistor of the present embodiment of the invention.

Thus in the transistor according to this embodiment, since crystalline defects in the high-resistivity region 14 are isolated from the active emitter region by the completely depleted emitter layer, the performances of the transistor are not influenced by the crystalline defects. Therefore, excellent transistor performances are obtained. In addition, since the emitter electrode can be directly wired to the outside of the emitter region without intervention of any contact hole, miniaturization of the transistor device can be easily realized.

In the foregoing embodiment, the thickness of the emitter layer is reduced for the purpose of the isolation between the active emitter region and the crystalline defects, and the thickness-reduced emitter layer is directly contacted with the emitter electrode and depleted by the Schottky barrier. However, the same depletion effect can be obtained, in place of the formation of the Schottky barrier, by combining the thickness-reduced emitter layer and pinning of a Fermi level on the surface of the semiconductor or by introducing crystalline defects in the vicinity of the surface through the ion implantation to reduce the effective emitter thickness and to pin the Fermi level nearly in the middle of a forbidden band.

EMBODIMENT 2

Explanation will next be made as to a second embodiment of the present invention in which an emitter layer is depleted by pinning a Fermi level.

In this embodiment, crystalline defects are introduced in the vicinity of the surface through the ion implantation to effectively reduce the emitter thickness and to pin the Fermi level nearly in the middle of a forbidden band, thereby realizing the depletion of an emitter layer.

Figure 6A:
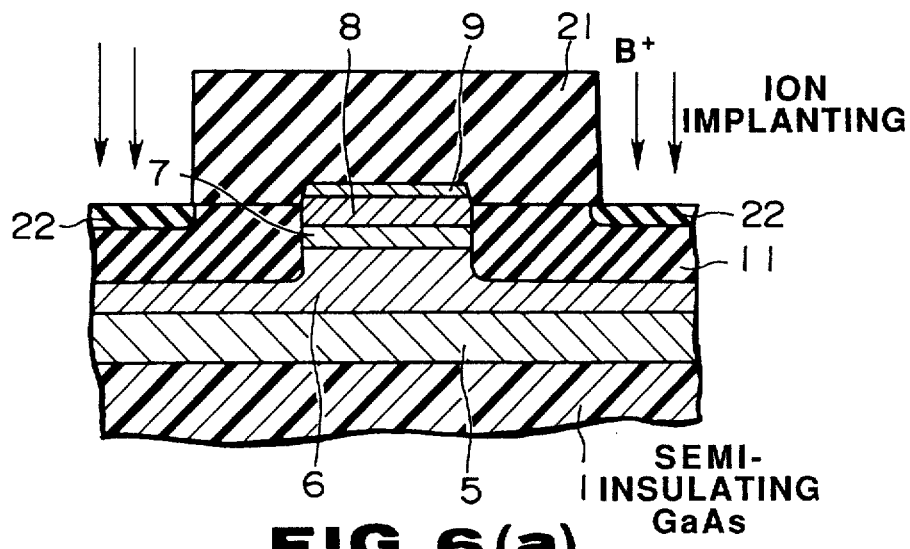
FIGS. 6(a) to 6(m) show steps of fabricating a heterojunction bipolar transistor in accordance with a second embodiment of the present invention respectively.
Figure 6B:
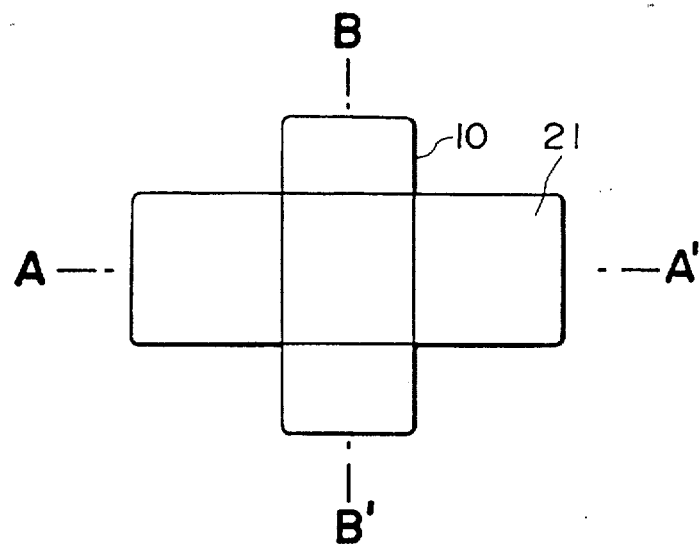
Figure 6C:
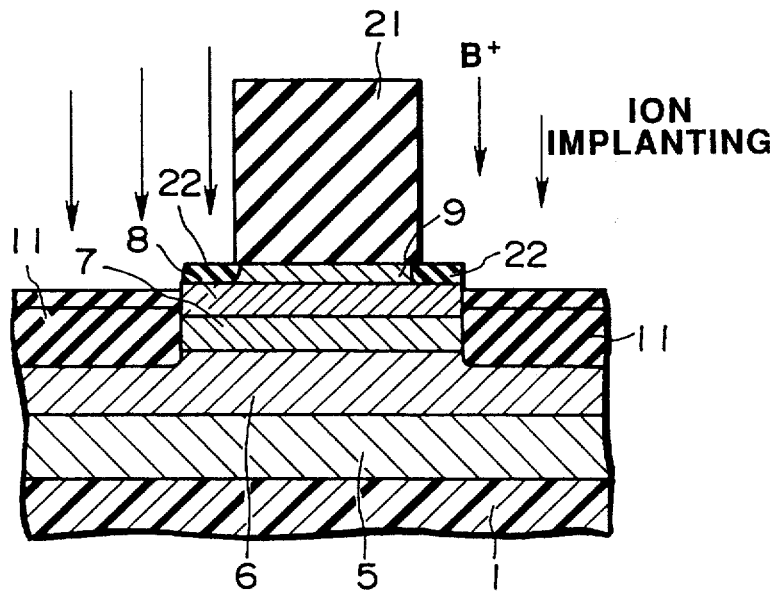

More specifically, a high-resistivity layer 11 for isolation between a base and a collector is formed through boron ion implantation as shown in FIG. 2(b), a silicon oxide layer 21 of 2 μm thickness is deposited by the CVD process, the silicon oxide layer 21 is subjected to a photolithographic process and a reactive ion etching (RIE) process to have such a shape as to cover the active region of the device and then subjected to a boron ion implantation with use of the silicon oxide layer 21 as a mask under the conditions of a dose rate of $1 \times 10^{14}$ cm$^{-2}$ and an acceleration voltage of 30 keV to introduce crystalline defects in a depth of about 1000 Å below the surface of the device and to form a high-resistivity region 22 (refer to FIGS. 6(a) to 6(c)). FIGS. 6(a) and 6(c) are cross-sectional views taken along lines A—A' and B—B' in FIG. 6(b), respectively.

Figure 6D:
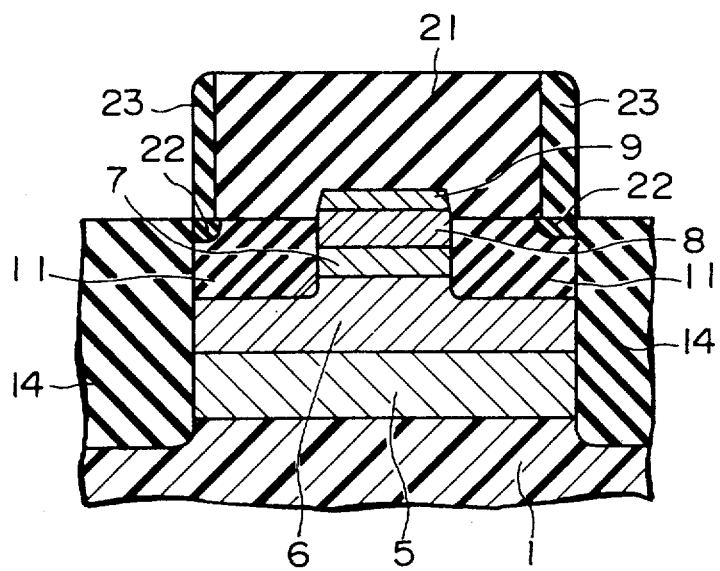
Figure 6E:
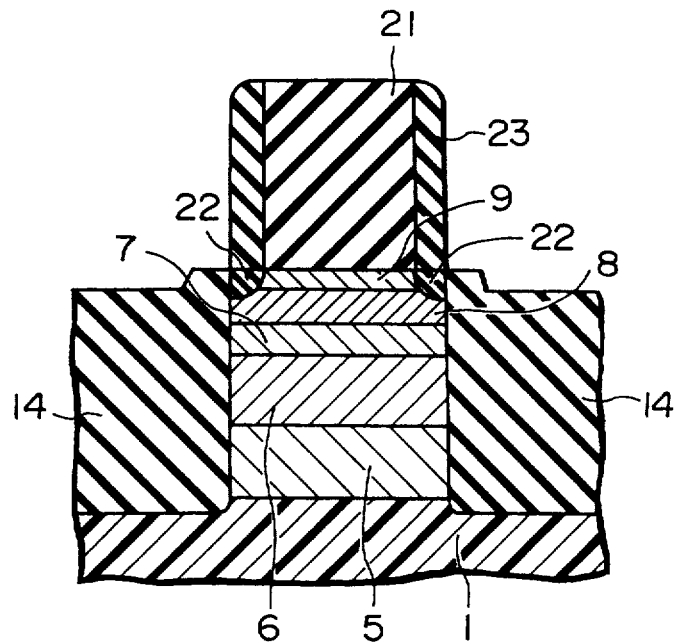

In the next step, as shown in FIGS. 6(d) and 6(e) which are cross-sectional views taken along lines A—A' and B—B' in FIG. 6(b), respectively, a silicon oxide film 23 of 5000 Å thickness is formed on the entire surface of the wafer by the CVD process, again subjected to the RIE process so as to remain only on the side wall of the silicon oxide film 21, and further subjected to a proton ion implantation under the conditions of an acceleration voltage of 200 keV and a dose rate of $2 \times 10^{15}$ cm$^{-2}$ to thereby form a high-resistivity region 14 for interelement isolation.

Figure 6F:
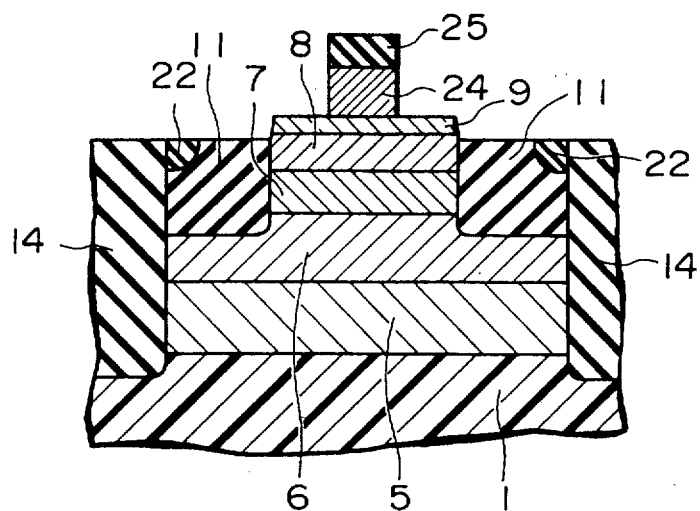

Subsequently, as shown in FIG. 6(f), the silicon oxide films 21 and 23 used as the masks are removed by an etching process with use of buffer hydrofluosilic acid, a tungsten siliceous WSi$_x$ layer 24 of 4000 Å thickness is deposited on the entire surface of the wafer by a sputtering process, a silicon oxide film 25 of 4000 Å thickness is formed by the CVD process and then subjected to a patterning to remain only in a region intended as an emitter electrode 24.

Figure 6G:
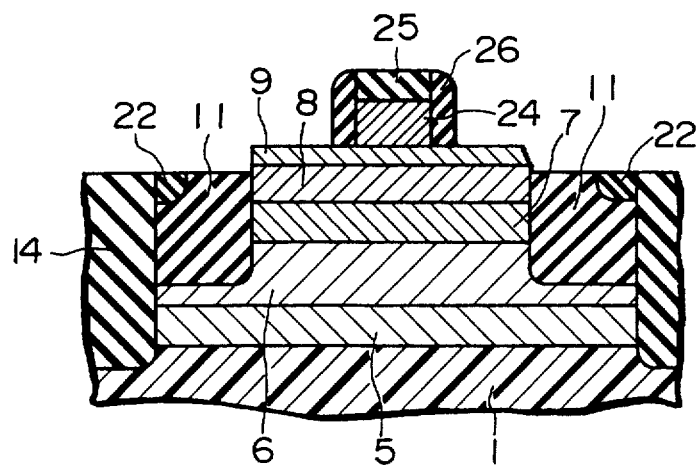

Further, as shown in FIG. 6(g), a silicon oxide film of 2500 Å thickness is deposited on the entire surface of the wafer by the CVD process and then subjected again to the RIE process to form a side-wall insulating film 26 on the side walls of the emitter electrode 24 and the silicon oxide film 25 formed as its upper layer.

Figure 6H:
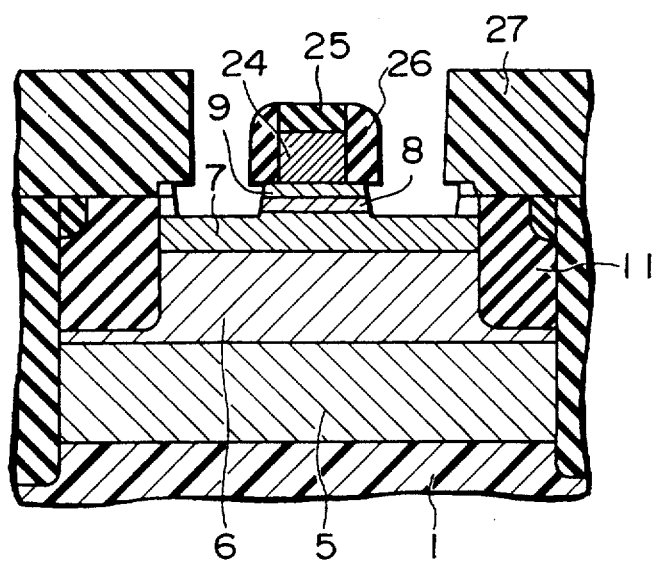

Thereafter, as shown in FIG. 6(h), a resist pattern as a mask 27 for the formation of a base electrode is formed and the emitter contact layer 9 and the emitter layer 8 are subjected to an etching process to expose the base layer 7. In the etching process, since the emitter electrode 24 is covered with the silicon oxide films 25 and 26, any abnormal etching caused by a local battery effect can be avoided.

Figure 6I:
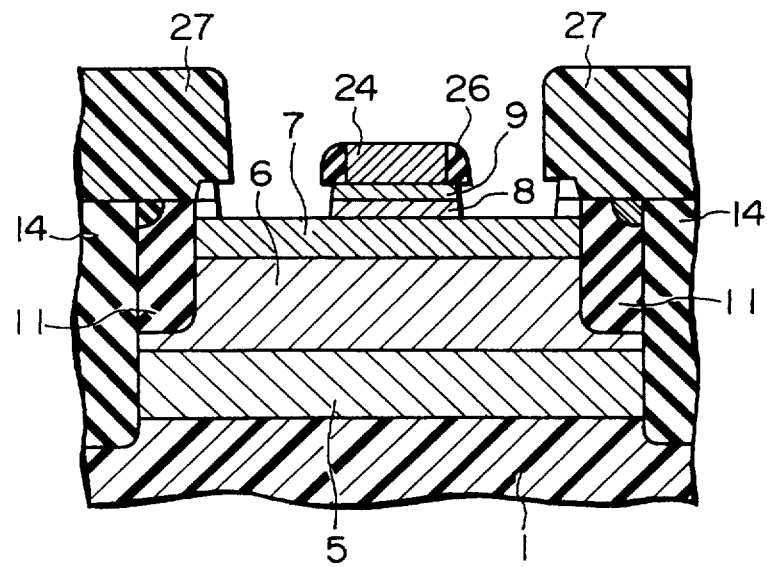

Further, as shown in FIG. 6(I), the silicon oxide layer 25 on the emitter electrode 24 is etched away by the RIE process to expose the emitter electrode 24.

Figure 6J:
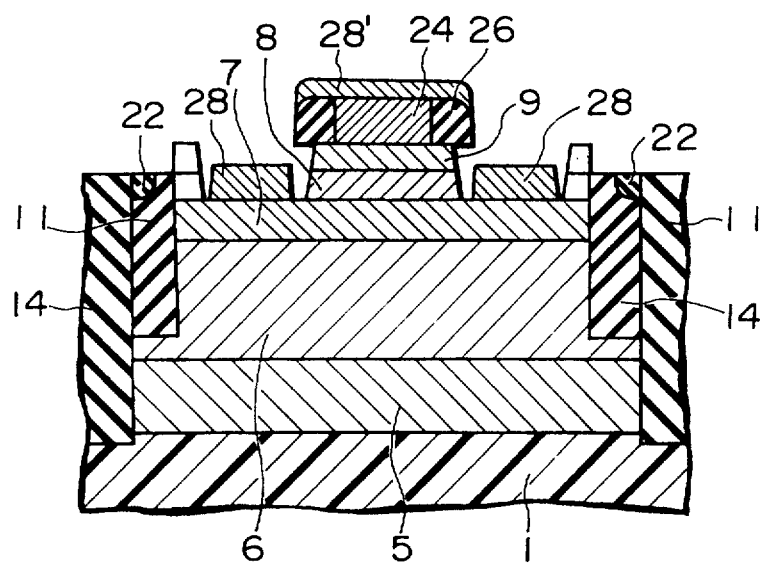

Then, as shown in FIG. 6(j), an electrode layer made of an alloy of chromium, platinum and gold is deposited on the entire surface of the wafer, and the resist pattern 27 is removed by a lift-off process to form a base electrode 28. The electrode layer 28' on the emitter electrode 24 works as emitter electrode wiring.

Figure 6K:
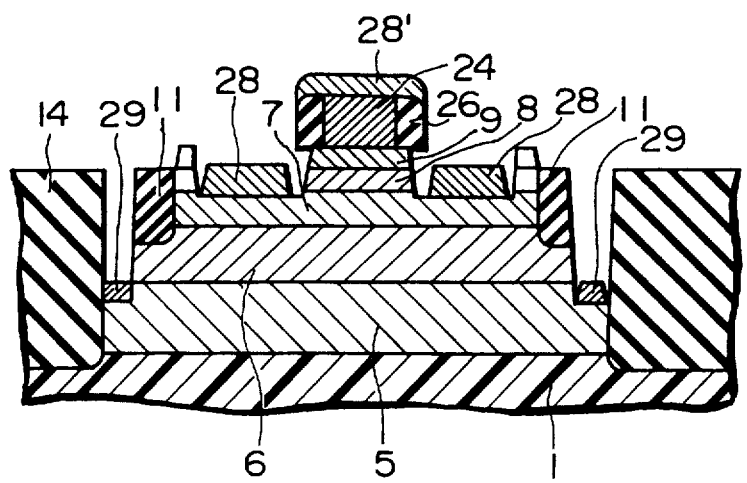
Figure 6L:
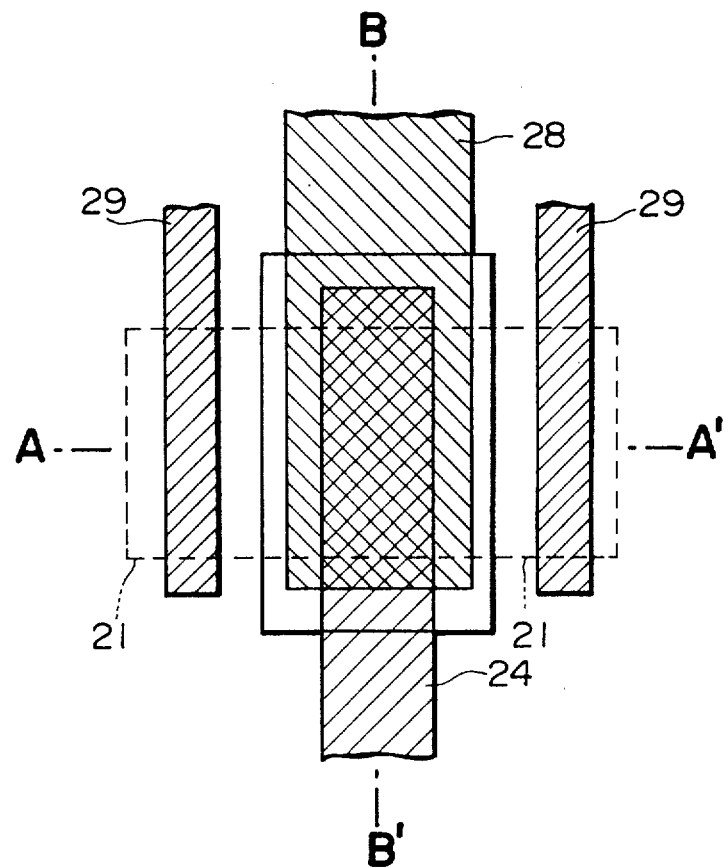
Figure 6M:
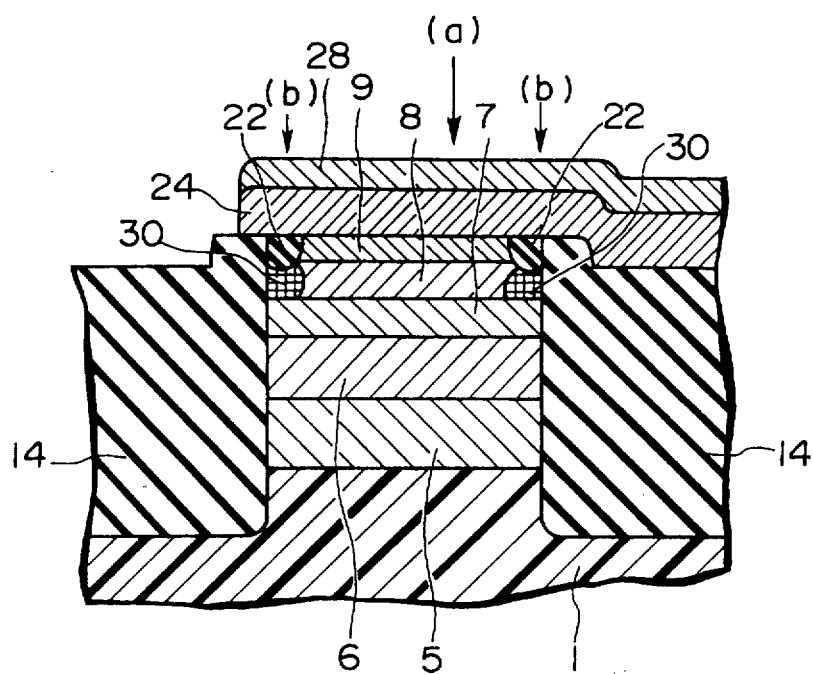

Next, as shown in FIGS. 6(k) to 6(m), a hole reaching the collector contact layer 5 is made in the wafer, an Au-Ge layer is deposited therein by a deposition process and then subjected to a lift-off process to form a collector electrode 29, thus completing a transistor. FIGS. 6(k) and 6(m) are cross-sectional views taken along lines A—A' and B—B' in FIG. 6(I), respectively.

Figure 7:
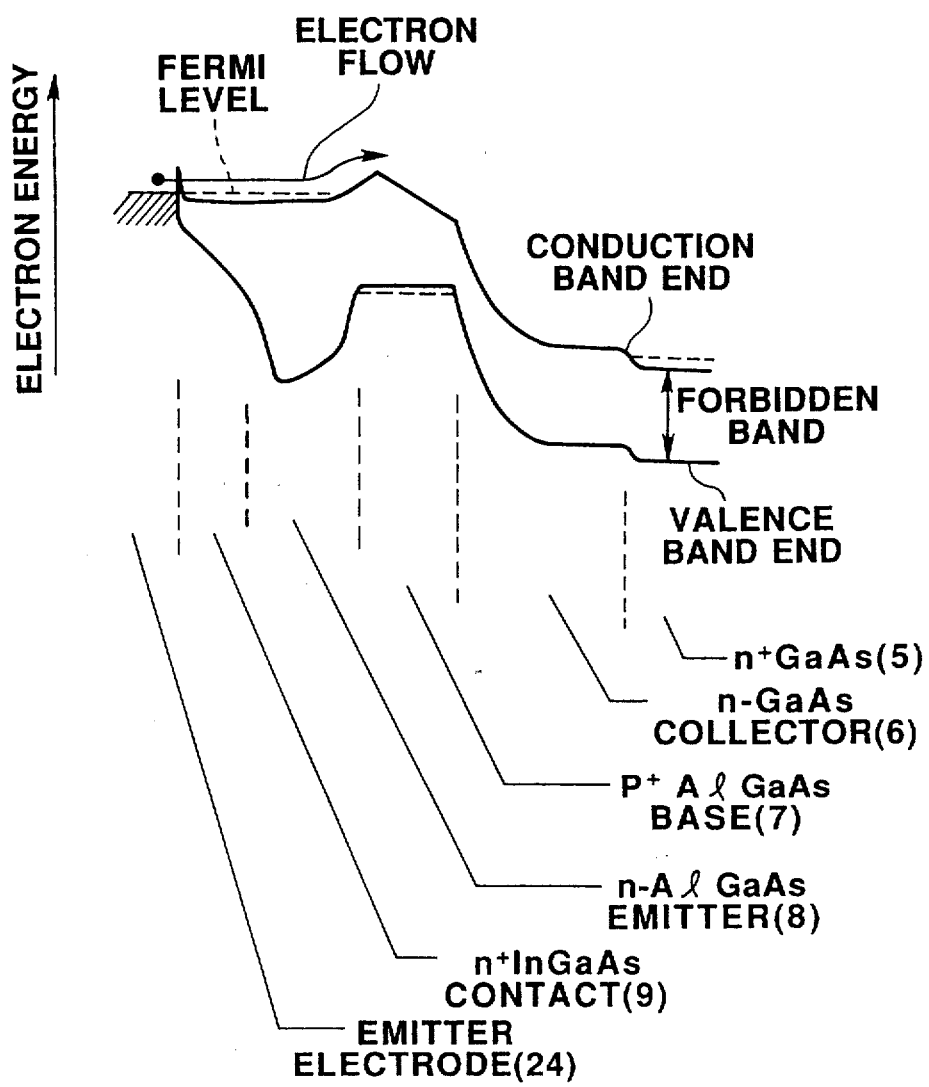
FIGS. 7 and 8 are diagrams for explaining an energy band structure for the transistor of the second embodiment respectively.

FIG. 7 shows an energy band structure of an epitaxially grown film at a position shown by an arrow (a) in FIG. 6(m) in its laminated layer direction. In FIG. 7, as in the case of FIG. 3 showing the embodiment 1, the emitter/base junction is forward biased and the transistor is put in its active state. Since a Schottky potential barrier level between the emitter electrode 24 and the emitter contact layer 9 is high and the doping concentration of the contact layer is high, electrons can pass through the potential barrier and move from the emitter electrode 24 to the emitter contact layer 9 by the tunnel effect and thus a good ohmic contact can be obtained.

Figure 8:
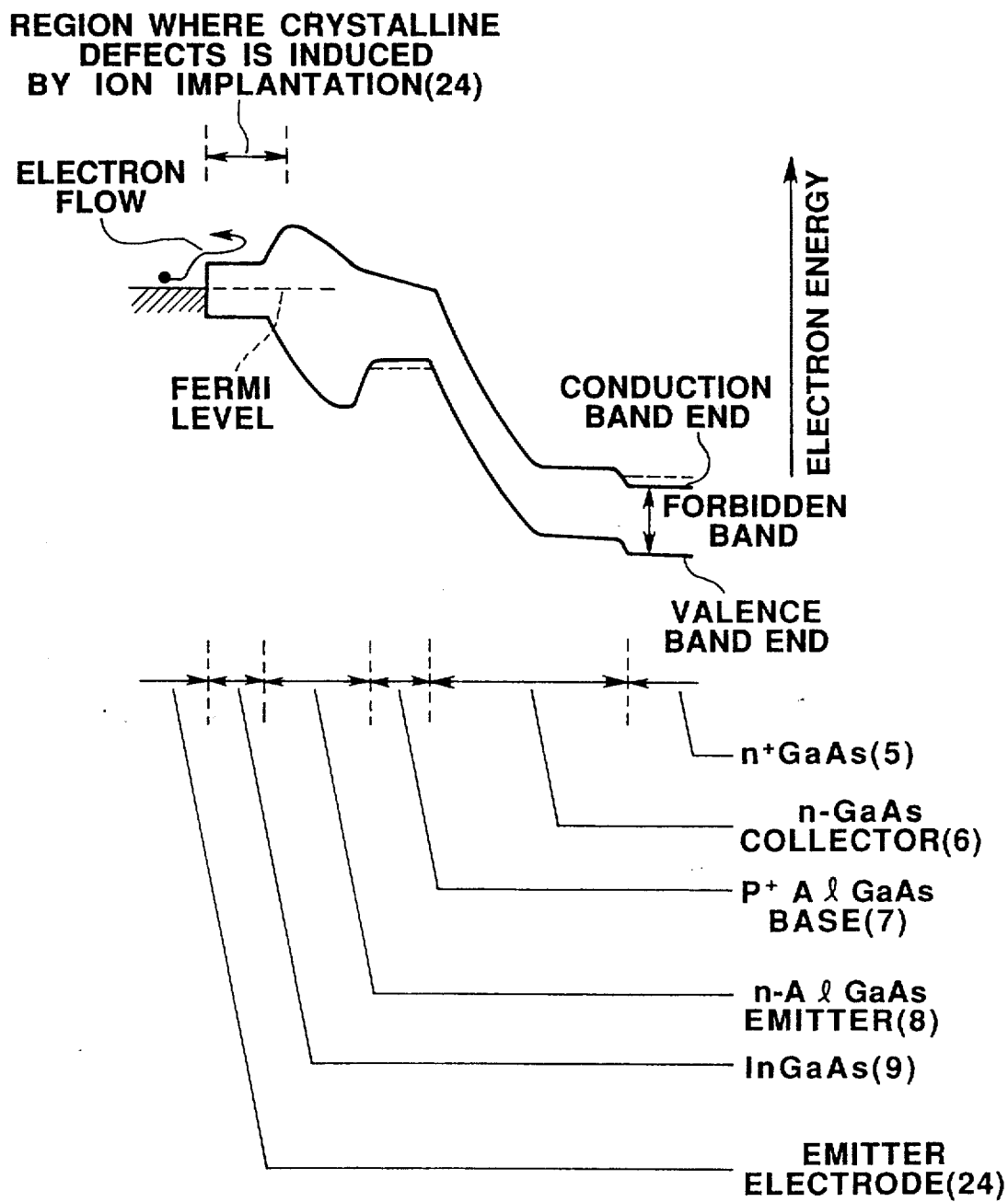

FIG. 8 shows an energy band structure of the epitaxially grown film at a position shown by an arrow (b) in FIG. 6(m) in its laminated layer direction. At the point (b), since the ion-implanted high-resistivity layer 22 is formed up to a depth of about 1000 Å below the emitter electrode 24, the Fermi level in the vicinity of an interface between the InGaAs layer as the emitter contact layer 9 and the AlGaAs layer 8 as the emitter is pinned nearly in the vicinity of the middle of the forbidden band and a part of the AlGaAs layer 8 is depleted throughout its full thickness. Such depletion region is represented by reference numeral 30 in FIG. 6(m).

As a result, since electrons injected from the emitter electrode 24 into the emitter contact layer 9 cannot reach the ion-injected high-resistivity layer 14 due to the presence of the depletion region 30, a current resulting from the generation and recombination of electrons at crystalline defects will not increase. Thus, as in the embodiment 1, the current gain of the transistor increases remarkably.

In this embodiment, the base electrode 28 is provided on both sides of the emitter electrode 24. However, the present invention is applicable to the type in which the base electrode is provided only on one side of the emitter electrode. In applying the present invention to this type, an interface between the base-collector isolation region and the emitter layer is also a recombination center. Therefore, a depleted region is provided for the interface.

EMBODIMENT 3

Explanation will then be made as to a third embodiment of the present invention.

In this embodiment, an emitter layer is depleted by surface-pinning a Fermi level in a III-V compound semiconductor.

More in detail, a high-resistivity layer 11 for isolation between a base and a collector is formed by the boron ion implantation as shown in FIG. 2(b) and subjected to a mesa etching process to expose the collector contact layer 5 and the base layer 7, an emitter electrode 31 is formed on the emitter contact layer 9, a base electrode 32 is formed on the base layer, a collector electrode 33 is formed on the collector contact layer. Thus, a transistor shown in FIGS. 9(a) to 9(c) is formed.

Figure 9A:
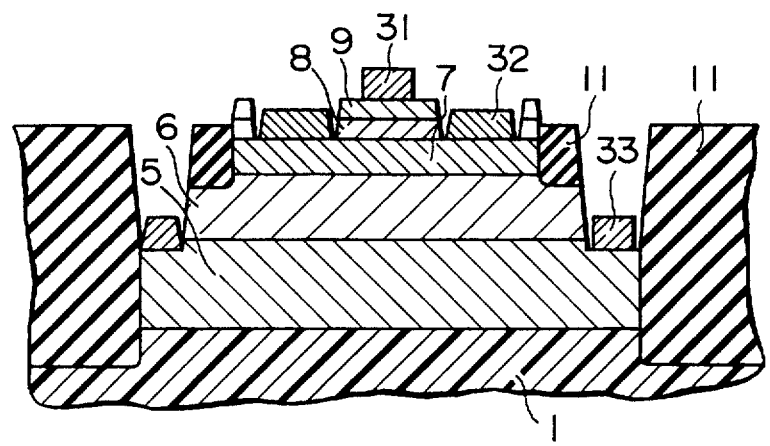
FIGS. 9(a) to 9(c) show steps of fabricating a heterojunction bipolar transistor in accordance with a third embodiment of the present invention respectively.
Figure 9B:
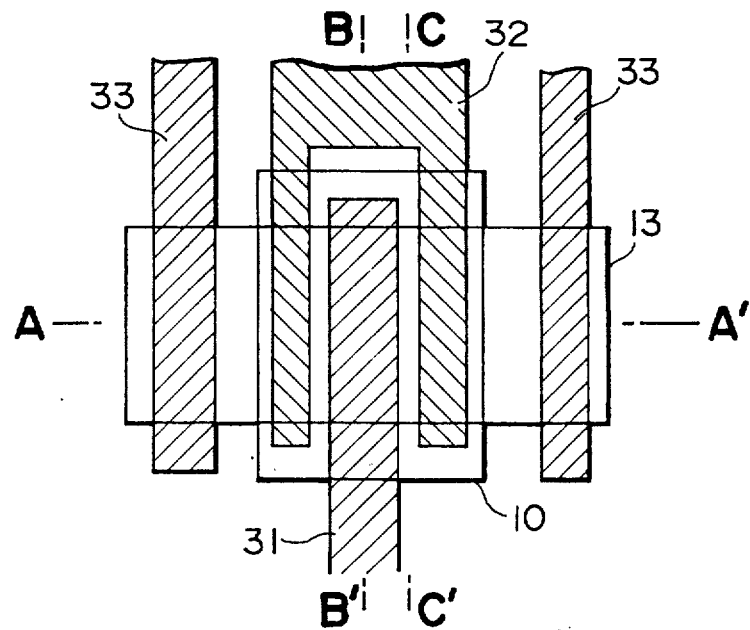
Figure 9C:
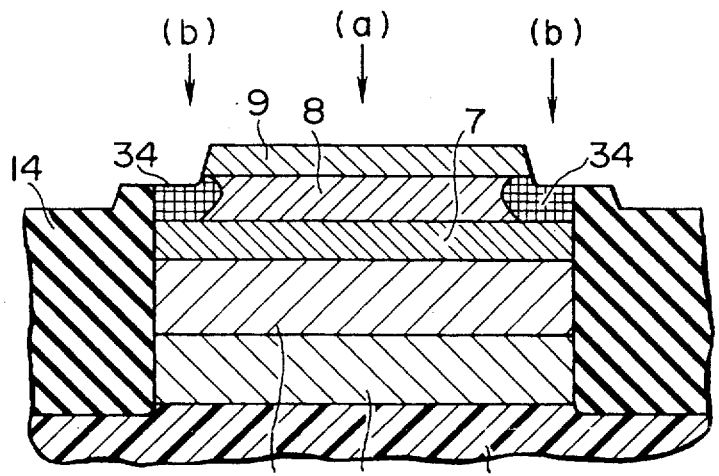

FIGS. 9(a) and 9(c) are cross-sectional views taken along lines A—A' and C—C' in FIG. 9(b), respectively.

Figure 10:
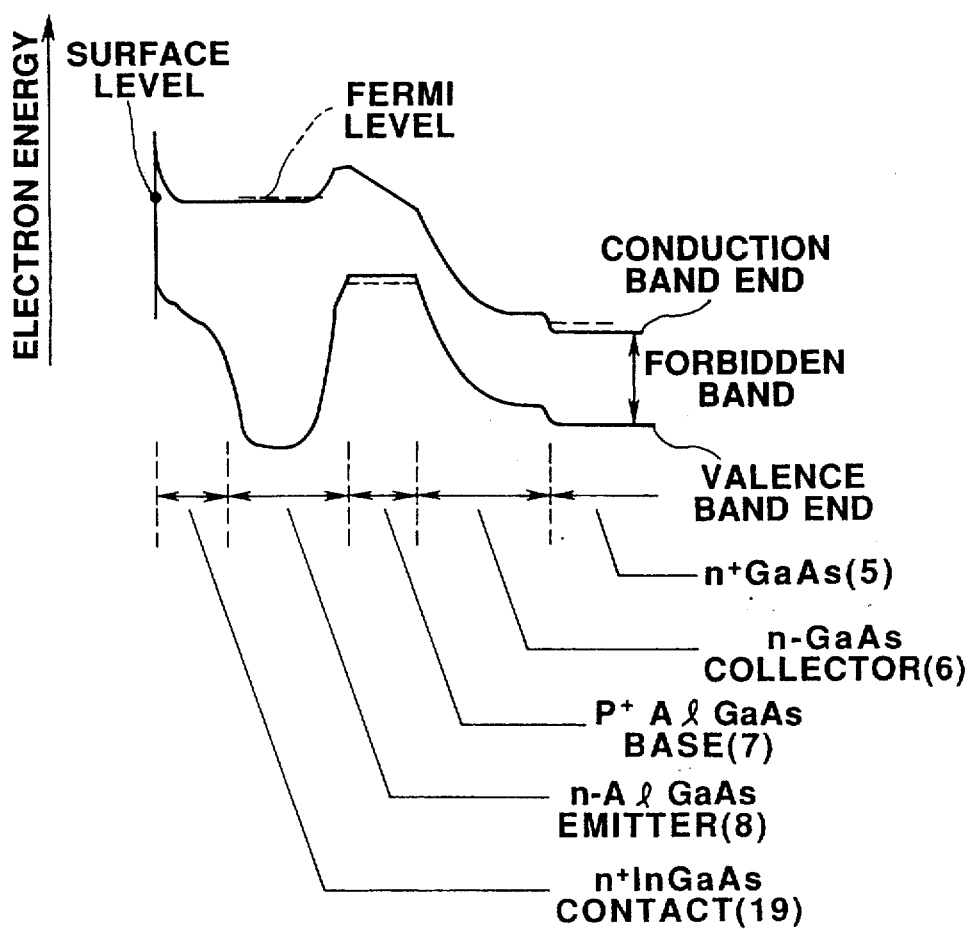
FIGS. 10 and 11 are diagrams for explaining an energy band structure for the transistor of the third embodiment respectively.

FIG. 10 shows an energy band structure of an epitaxially grown film at a position shown by an arrow (a) in FIG. 9(c) in its laminated layer direction. In this embodiment, since the heavily doped emitter contact layer 9 is present, a surface depletion layer does not reach the emitter layer 8.

Figure 11:
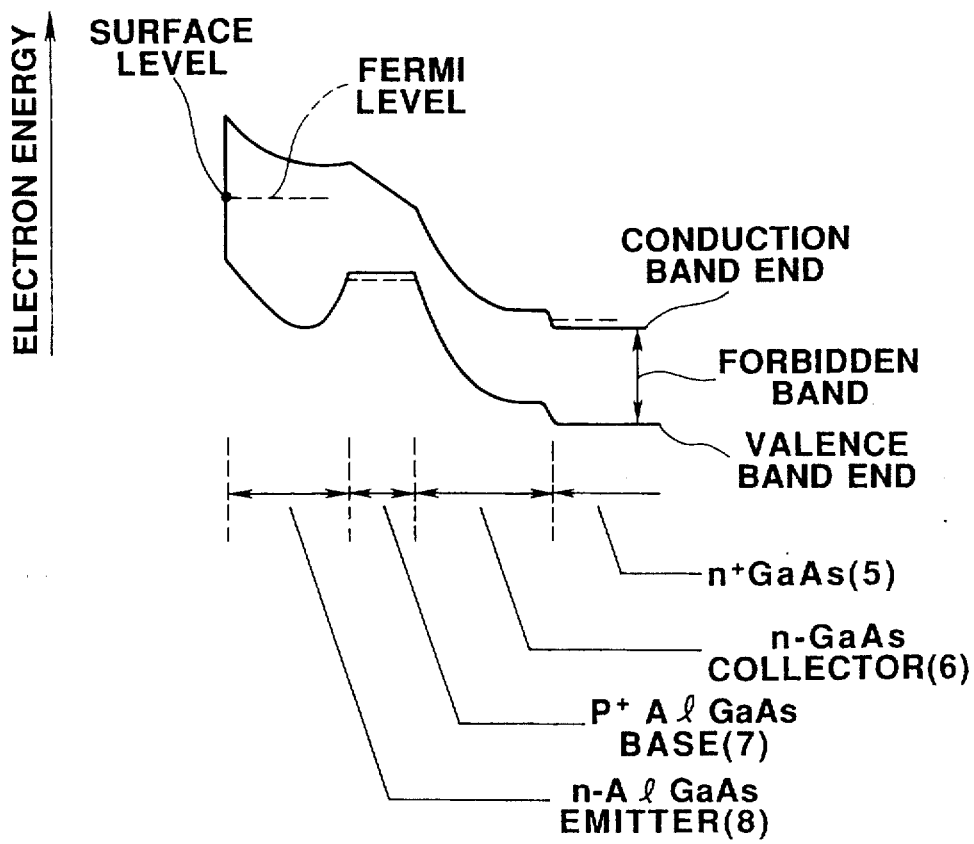
Figure 12:
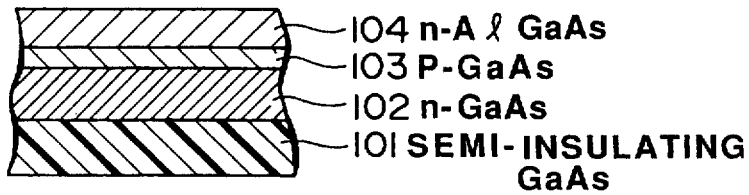
FIGS. 12 to 18 show a conventional heterojunction bipolar transistor.

FIG. 11 shows an energy band structure of an epitaxially grown film at a position shown by an arrow (b) in FIG. 9(c) in its laminated layer direction. At the point (b), the AlGaAs layer 8 is exposed on the surface of the semiconductor and its Fermi level is pinned at 0.7-1.0 eV below from the bottom of a conduction band. As a result, a surface depletion layer 34 is provided as extended along the full thickness direction of the emitter layer 8. This means that, since electrons injected from the emitter collector layer 9 into the emitter layer cannot be diffused in an interface direction with the high-resistivity region 14, a current resulting from the generation and recombination of electrons at crystalline defects will not increase. Thus, as in the embodiment 1, a remarkably large current gain can be realized.

What is claimed is:

1. A semiconductor device comprising:
   a collector layer;
   a base layer;
   an emitter layer, the collector layer, the base layer and the emitter layer sequentially laminated on a semiconductor substrate; and
   a high-resistivity layer provided in contact with a peripheral edge of the emitter layer,
   wherein a peripheral portion of the emitter layer contacted with the high-resistivity layer is completely depleted throughout a full thickness thereof.

2. A semiconductor device as set forth in claim 1, wherein the peripheral portion of the emitter layer is reduced in thickness relative to portions of the emitter layer other than the peripheral portion and is completely depleted throughout a full thickness thereof.

3. A semiconductor device as set forth in claim 1, wherein the high-resistivity layer is directly contacted with the peripheral edge of the emitter layer without a emitter contact layer therebetween.

4. A semiconductor device as set forth in claim 1 or 2, further comprising an emitter electrode made of metal extended onto the thickness-reduced portion of the emitter layer to form Schottky junction with the portion of the emitter layer.

5. A semiconductor device as set forth in any of claims 1 and 2, further comprising an emitter electrode extending onto the high-resistivity layer beyond the depleted peripheral portion of the emitter layer so as to be connected to another element or a pad region.

6. A semiconductor device as set forth in claim 1, further comprising:
   an emitter contact layer formed on the emitter layer, the size of the emitter contact layer being smaller than the size of the emitter layer;
   a high-resistivity region for isolating between elements, the high-resistivity region being formed around an element formation region by proton implantation; and
   an emitter electrode extending onto a part of the emitter layer contacted with an end face of the high-resistivity region for isolating between elements,
   wherein a part of the emitter layer uncovered with the emitter contact layer is completely depleted throughout a full thickness thereof by Schottky junction between the emitter electrode and the emitter layer.

7. A semiconductor device as set forth in claim 1, wherein the base layer extends only to one side of an interface region between the emitter layer and the base layer, and an interface region between a base-collector isolation region and the emitter layer is completely depleted.

8. A semiconductor device comprising:
   a heterojunction bipolar transistor including an n+ type GaAs layer as a collector contact layer, an n− type GaAs layer as a collector layer, a p+ type $Al_xGa_{1-x}As$ graded-composition layer as a base layer, an n− type $Al_xGa_{1-x}As$ as an emitter layer, and an n+ type $InAl_xGa_{1-x}As$ layer as an emitter contact layer sequentially laminated on a semi-insulating GaAs substrate;
   a high-resistivity layer for isolating the base layer from the collector layer, the high-resistivity layer being formed by boron ion implantation;
   a high-resistivity region for isolating between elements, the high-resistivity region being formed around an element formation region by proton implantation;
   a collector electrode contacted with the collector layer;
   a base electrode contacted with the base layer; and
   an emitter electrode extending onto a part of the emitter layer contacted with an end face of the high-resistivity region,
   wherein the emitter electrode and the part of the emitter layer form Schottky junction therebetween and the part of the emitter layer is completely depleted throughout a full thickness thereof.

9. A semiconductor device comprising:

a heterojunction bipolar transistor including a collector layer, a base layer and an emitter layer sequentially laminated on a semi-insulating substrate;

a high-resistivity layer for isolating the base layer from the collector layer, the high-resistivity layer being formed by ion implantation;

a high-resistivity region for isolating between elements, the high-resistivity region being formed around an element formation region by proton implantation;

a collector electrode contacted with the collector layer;

a base electrode contacted with the base layer;

an emitter contact layer having a high concentration formed on the emitter layer;

an emitter electrode as contacted with the emitter contact layer; and a high-resistivity layer formed by ion implantation on the emitter contact layer at least on a part thereof adjacent to an end face of the high-resistivity region, wherein the part of the emitter layer adjacent to the end face of the high-resistivity region is completely depleted throughout a full thickness thereof.

* * * * *